(12) United States Patent
Dyer et al.

(10) Patent No.: US 7,067,879 B1
(45) Date of Patent: Jun. 27, 2006

(54) INTEGRATION OF TRENCH POWER TRANSISTORS INTO A 1.5 μM BCD PROCESS

(75) Inventors: Terry Dyer, Strathclyde (GB); Jim McGinty, East Kilbride (GB); Andrew Strachan, Santa Clara, CA (US); Constantin Bulucea, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/857,152

(22) Filed: May 28, 2004

(51) Int. Cl.
*H01L 29/72* (2006.01)

(52) U.S. Cl. .................. 257/341; 257/329; 257/378
(58) Field of Classification Search ............... 257/341
See application file for complete search history.

(56) References Cited

U.S. PATENT DOCUMENTS

| | | | |
|---|---|---|---|
| 5,410,170 A | 4/1995 | Bulucea et al. | 257/332 |
| 5,629,558 A | 5/1997 | Galbiati et al. | 257/653 |
| 2003/0146489 A1 | 8/2003 | Shimizu | 257/521 |
| 2004/0063291 A1* | 4/2004 | Williams et al. | 438/309 |
| 2005/0161735 A1 | 7/2005 | Aoki et al. | 257/330 |

OTHER PUBLICATIONS

M.G.L. van den Heuvel et al., "An improved method for determining the inversion layer mobility of electrons in trench MOSFETs," (student paper), *Proc. ISPSD*, (2003), 4 pages in length.
R. K. Williams et al., "A 20-V P-channel with 650 μΩ—cm² at $V_{GS}$=2.7 V: Overcoming FPI Breakdown in High-Channel-Conductance Low—Vt TrenchFETs," *Proceedings of 1998 International Symposium on Power Semiconductor Devices & ICs, Kyoto*, (1998), pp. 411-414.
C. Bulucea et al., "Trench DMOS Transistor Technology for High-Current (100 A Range) Switching," *Solid-State Electronics*, vol. 34, No. 5, (1991), pp. 493-507.
C. J. Petti et al., "Characterization of Surface Mobility on the Sidewalls of Dry-Etched Trenches," *Proc. IEDM*, (1998), 4 pages in length.

* cited by examiner

*Primary Examiner*—Edward Wojciechowicz
(74) *Attorney, Agent, or Firm*—Stallman & Pollock LLP

(57) ABSTRACT

The formation of vertical trench DMOS devices can be added to existing integrated BCD process flows in order to improve the efficiency of the BCD devices. The formation of this trench DMOS varies from existing approaches used with discrete trench DMOS devices, in that only two extra mask steps are added to the existing BCD process, instead of the 10 or so mask steps used in existing discrete trench DMOS processes. Further, the location of these additional heat cycles in the BCD process steps can be placed so as to have minimal impact on the other components created in the process. Utilizing an integrated trench device in a BCD process can offer at least a factor-of-two $R_{DS(ON)}$ area advantage over a planar counterpart.

7 Claims, 8 Drawing Sheets

INTEGRATION OF TRENCH POWER TRANSISTORS INTO A 1.5 μM BCD PROCESS

TECHNICAL FIELD OF THE INVENTION

The present invention relates to semiconductor devices and processes for manufacturing those devices.

BACKGROUND

As the requirements for power semiconductor applications have increased, integrated circuit (IC) technology has been developed which integrates DMOS devices with high performance Bi-polar CMOS components. These components, known in the industry as BCD or BCDMOS devices, can be formed using an integrated BCD (Bi-polar-CMOS-DMOS) process, and can include one or more transistors, such as a number of high-voltage transistors on a single chip as low-voltage circuitry. These BCD devices can provide increased control and efficiency for many power IC applications. For instance, advanced BCDMOS processes can be used to optimize aspects of integrated circuits used in such devices as cameras, printers, projectors, and DVD drives. In power IC applications where a number of discrete components were previously required, many of those discrete components can be replaced with a single, highly integrated BCDMOS device. In addition to improved performance, such a solution comes with added benefits such as a significant reduction in component and assembly costs.

While these BCD devices have had a marked effect on power IC applications, the ever-increasing demands push chip manufacturers to further improve efficiency and performance. It is therefore desirable to improve upon existing BCD processes in devices in order to meet these demands.

DETAILED DESCRIPTION

Power MOS applications can utilize any of a number of power devices such as DMOS transistors. These DMOS devices can include lateral (LDMOS), vertical (VDMOS), and trench DMOS devices as known in the art. While lateral and vertical DMOS devices have been utilized in integrated process flows, trench DMOS devices have to this point been utilized by manufacturers making discrete components, such as a single transistor on a piece of silicon, as the steps that would be necessary to utilize a trench DMOS in an integrated flow would have a significant impact on the other circuitry created in the process. This is unfortunate, as chip manufacturers have proven that trench DMOS devices can be much more efficient than VDMOS or LDMOS devices for many applications. For example, the size and performance of a power IC device such as a BCD device can depend on a specific "on-resistance", $R_{DS(ON)}$, at a particular break-down voltage, as is known in the art. It therefore can be desirable to minimize the RDS (ON) of the device while maintaining high break-down voltages. Utilizing an integrated trench device, such as a trench VDMOS device, can offer at least a factor-of-two $R_{DS(ON)}$ area advantage over a planar counterpart, such as for a 50V device.

Figure 1:
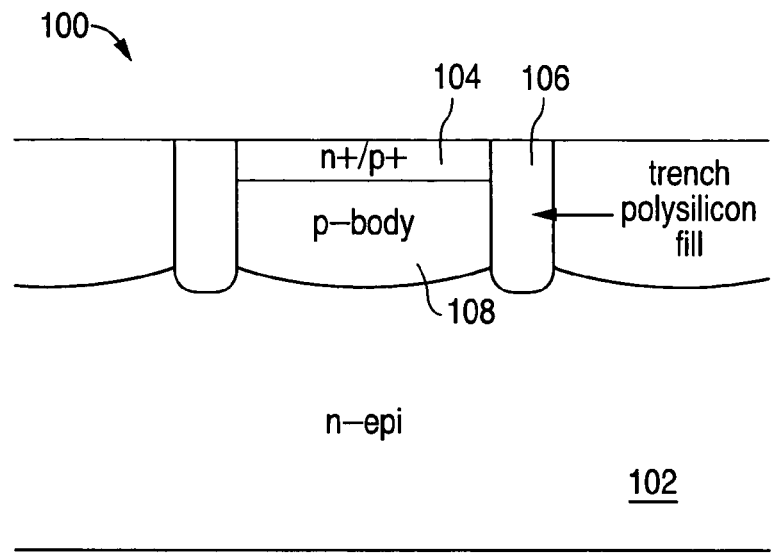
FIG. 1 is a schematic diagram of a trench VDMOS device that can be used in accordance with one embodiment of the present invention.

A schematic diagram of a trench VDMOS device 100 is shown in FIG. 1. In the Figure, a trench 106 is shown extending into an n– epitaxy region 102. The trench 106 can be filled with a material such as doped polysilicon, such that the trench can act as a gate electrode for the transistor. A heavily doped n+/p+ region 104 can act as a source for the transistor, with the n– epitaxy region 102 serving as the transistor drain. A p-body region 108 between the source 104 and drain 102 regions can function as the channel of the transistor. This is similar to a CMOS device, except that in this arrangement the current flows through the vertical channel (in the Figure) instead of horizontally across the planar channel and then vertically to the drain pickup. Systems and methods in accordance with embodiments of the present invention can allow such a trench MOSFET to be fully integrated into a standard BCD process/device.

Incorporating a trench MOS device into an existing BCD process, however, is not a trivial matter. As trench MOS devices have been the domain of discrete device manufacturers, the trench formation processes have never had to be concerned with interfering with CMOS or bi-polar devices. The additional heat cycles used to form a trench MOSFET using existing processes can cause unacceptable and/or irreparable damage to other components in the integrated device. Therefore, existing formation processes for these trench DMOS devices may not be simply added to an existing BCD process flow. Further, simply adding a trench DMOS process to an integrated process flow, such as to replace a vertical DMOS in a 1.5 μm BCD process, can add an additional 10 different mask steps, which can be prohibitively expensive for many manufacturers and/or applications. It would be preferable to minimize the amount of disruption and/or additional steps introduced into the existing BCD process. Further, the trench process cannot simply be added to the beginning of the BCD process, as the epitaxy and field oxidations are necessary for the trench process. The trench process also cannot be done at the end of the BCD process, as the additional heat and/or heat cycles can unacceptably damage other components in the integrated device. The position in the integrated BCD process at which the trench process is injected should be selected such that maximum number of necessary elements is in place before the trench process while the overall affect on other components of the integrated device is minimized.

In an exemplary core planar BCD process that can be used in accordance with embodiments of the present invention, 19 masks are used in conjunction with LOCOS isolation using a 2 layer metal scheme as known in the art. In existing trench DMOS processes, which are utilized for discrete devices, approximately 10 masks are needed. Systems and methods in accordance with embodiments of the present invention can allow an integrated trench VDMOS module to be integrated into the existing BCD process while utilizing only two masks in addition to those of the BCD process. This is possible due to the fact that many of the existing masks in the BCD process can be used with the formation of the integrated trench device, as well as the fact that the trench formation steps are inserted in the process at a location in which the additional thermal cycles involved in the trench module have a minimal effect on the other components of the integrated device.

Figure 2:
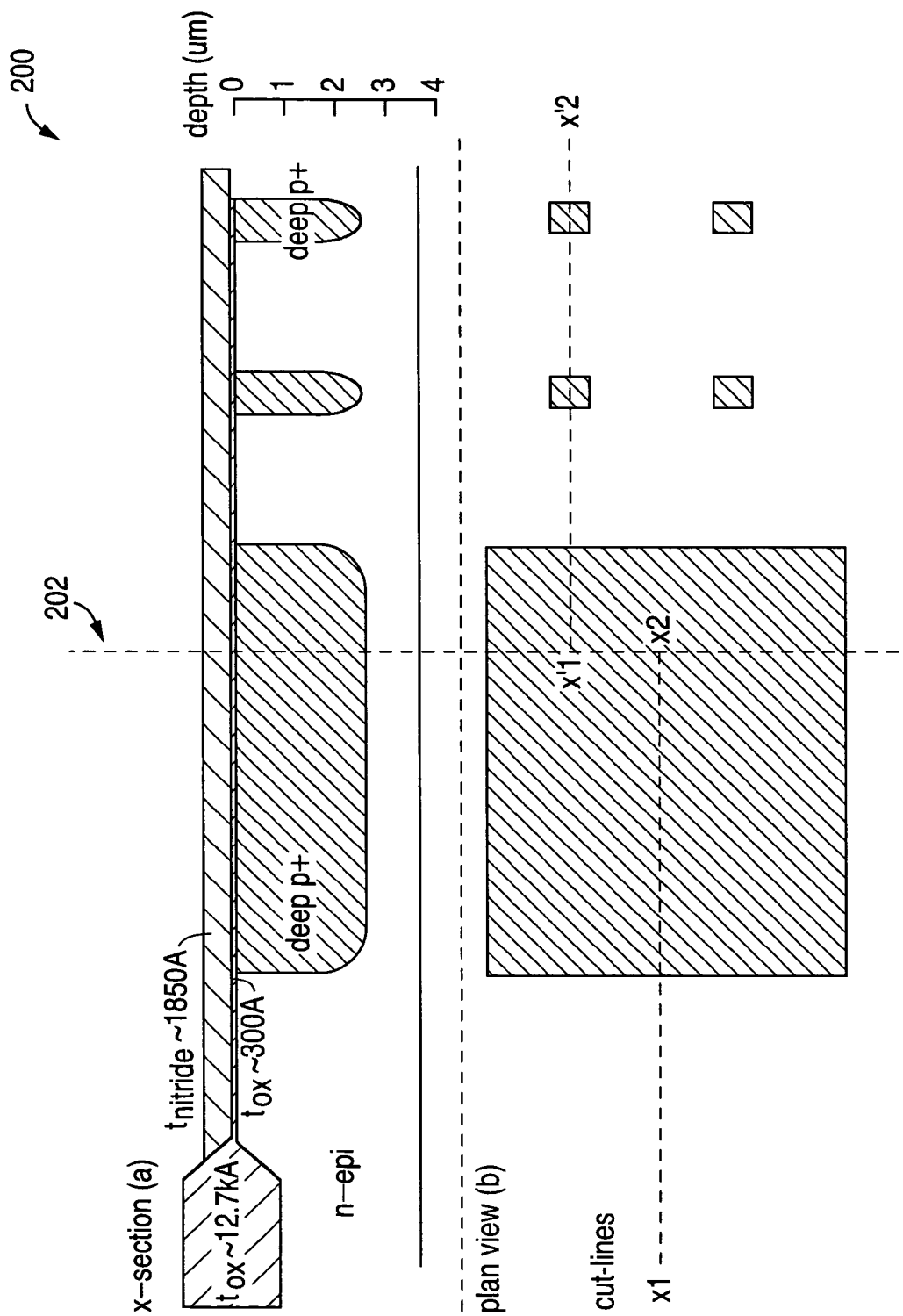
FIG. 2 is a cross-section and top view of a device at a first location within a BCD process in accordance with one embodiment of the present invention.

Initial steps of an existing, integrated process flow can be executed to generate the epitaxy on the wafer and undergo an initial implant process, resulting in the device 200 shown in FIG. 2. In the figure can be seen a cross-section (a) of the device and a corresponding top view (b), showing the relative locations of the implant regions for this example. The portion of the Figure to the right of the vertical line 202 corresponds to the transistor, and the portion to the left of the line in the Figure corresponds to the trench gate contact region. An area of polysilicon will be formed in the contact area that will have a metal contact laid down upon it at a later process step, in order to provide a contact between the transistor gate and the outside world.

Figure 3:
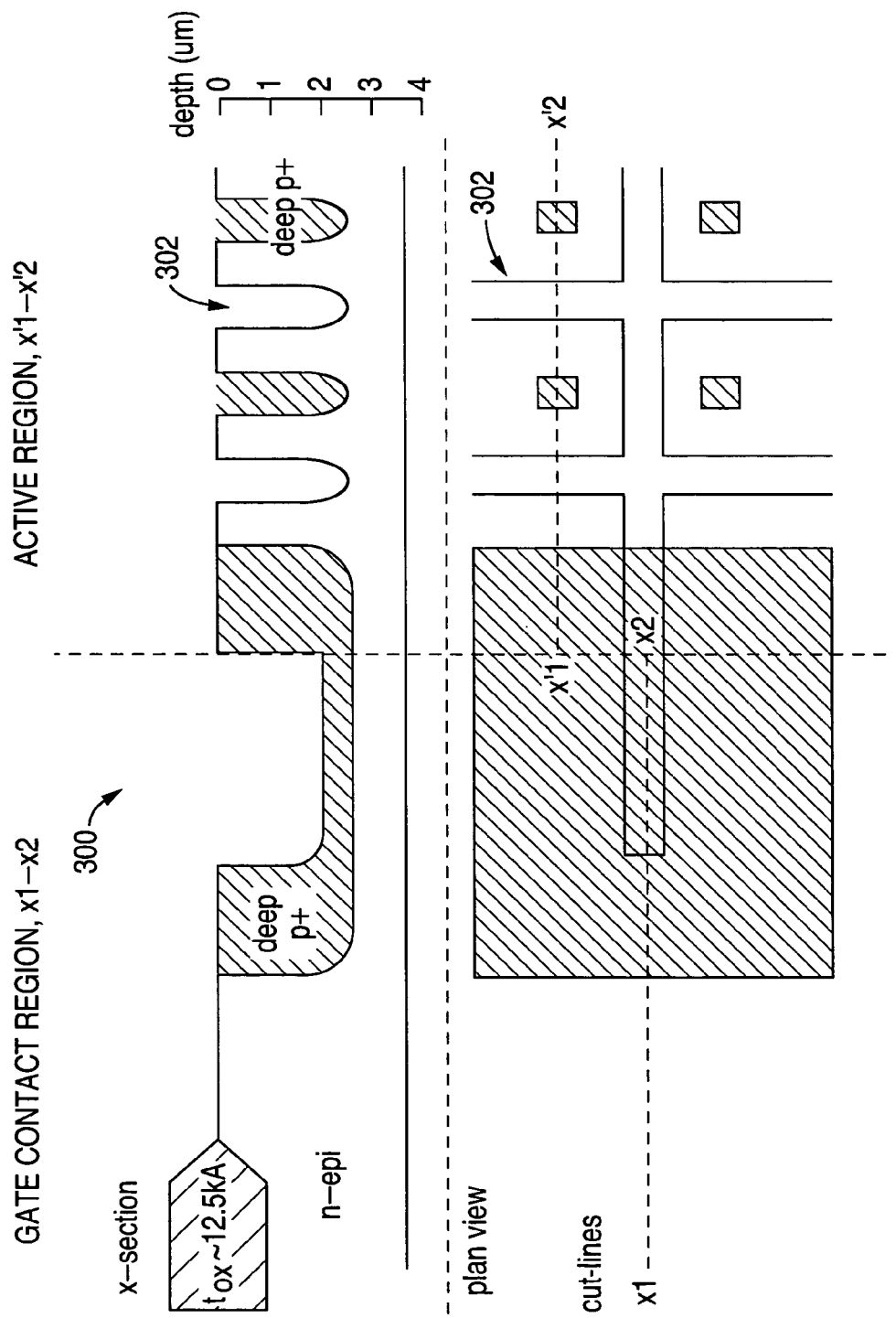
FIG. 3 is a cross-section and top view of a device at a first location within a BCD process in accordance with one embodiment of the present invention.

A first step of an exemplary trench etch process, such as a reactive ion etch (RIE) process, can be added to the existing integrated process flow at a point following the formation of the device in FIG. 2, leading to the device 300 of FIG. 3. In an exemplary RIE process, an etch rate of about ~0.7 μm/min can be used with a mask selectivity of about 40:1. A composite mask of an oxide/nitride stack can be used as a hard mask to etch a trench array 302 for each trench DMOS device, with the trench in this example being approximately 2 μm in depth and approximately 1 μm in width. An etch process such as a wet etch can be used to remove the hard mask from the front and back of the wafer after the etch.

Figure 4:
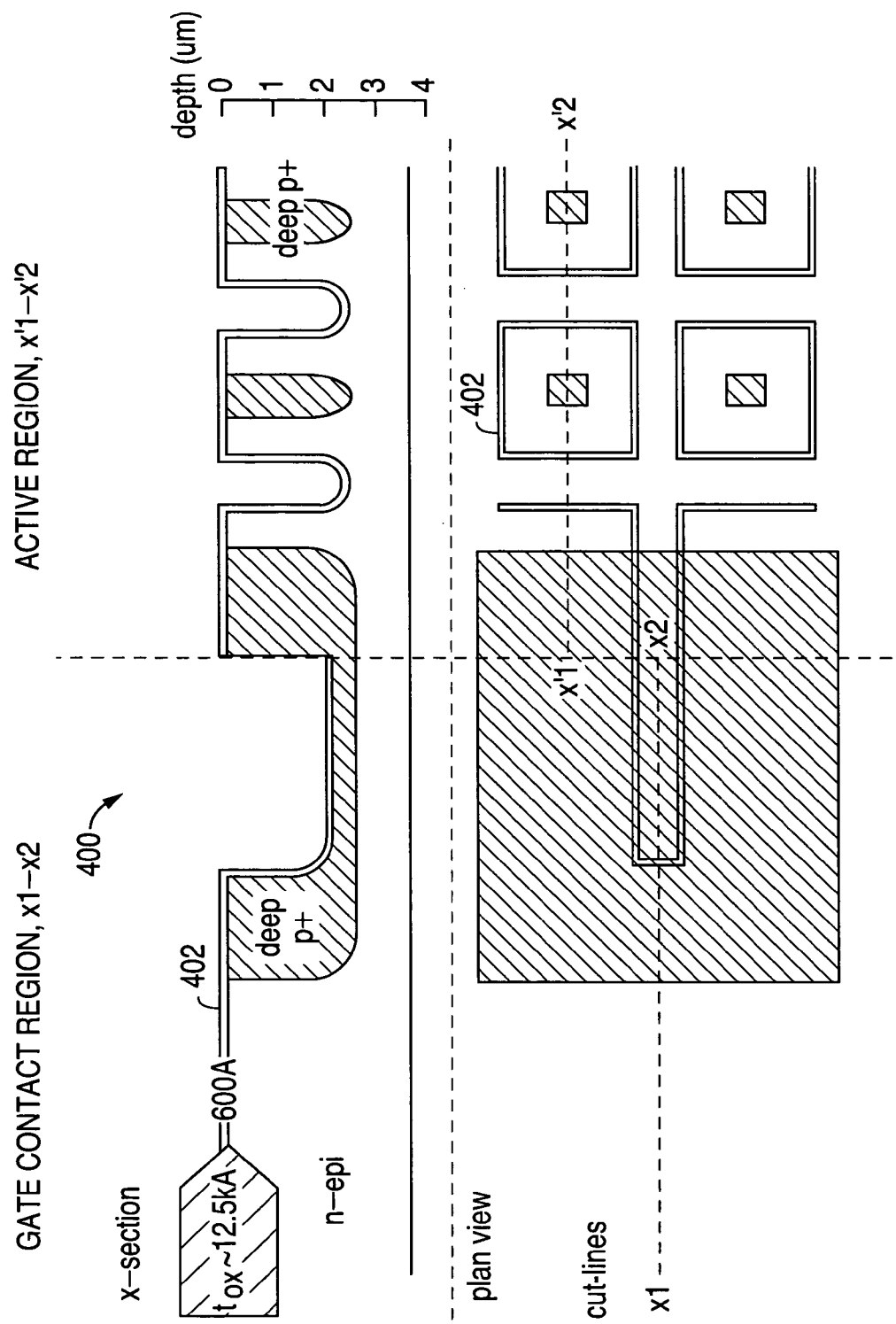
FIG. 4 is a cross-section and top view of a device at a second location within a BCD process in accordance with one embodiment of the present invention.

An oxidation step then can be undergone, such as a 600 Å dry thermal oxidation process step, resulting in the growth of a sacrificial oxide layer 402 as shown in the device 400 of FIG. 4. This sacrificial oxide 402 then can be stripped in order to clean the sidewalls of each trench, removing any contamination and possible stress damage. The oxide can be removed using a process such as a HF dip process. One key aspect of the comparison of a discrete trench DMOS and an exemplary integrated trench DMOS created with such a process is the location of the drain contact (not shown). Discrete trench DMOS devices have the drain contact on the back side of the structure, which would not work in the integrated device with multiple trench DMOS devices on the same chip, as well as other device types. In an integrated device such as that shown in FIG. 4 the drain contact can be formed from the surface of the wafer. The drain contact area can consist of a buried, heavily doped n-type layer implanted through a mask before epitaxy. This area can be linked at various locations to a deep, heavily doped n-type diffusion which can be masked and implanted after epitaxy. Such a drain contact is the same as used on the planar vertical DMOS transistor originally in the BCD process. The drain contact is also the same as the collector contact to the NPN bipolar in the original BCD process, meaning that the addition of this type of surface drain contact to a trench DMOS requires no extra processing steps.

Figure 5:
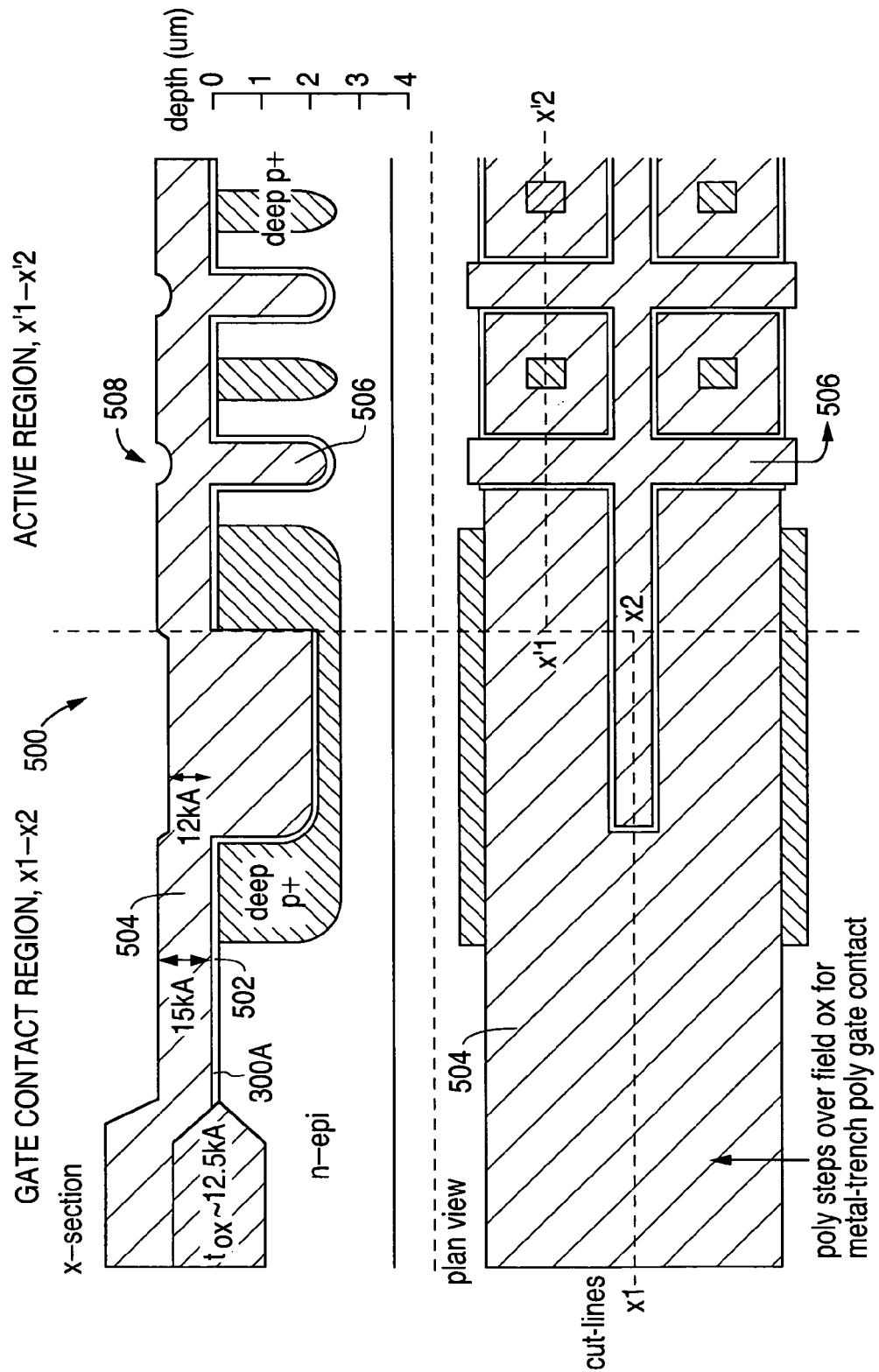
FIG. 5 is a cross-section and top view of a device at a third location within a BCD process in accordance with one embodiment of the present invention.

A high quality oxide growth step then can be undergone, such as a 300 Å dry thermal oxidation process step, in order to form a trench gate oxide layer 502 such as is shown in the device 500 of FIG. 5. The oxidation is of a high quality since the trench is being used as the gate of the transistor. A polysilicon layer 504 then can be deposited, such as a 15 kÅ thick layer of polysilicon deposited by a LPCVD process in order to fill the trench 506, such that the polysilicon can act as a gate of the respective transistor. While the overall thickness of the layer can be about 15 kÅ, there can be about a 3 kÅ recess 508 over each trench 506.

The recess 508 created over each trench 506 can cause problems when attempting to etch the polysilicon layer 504. In order to address the problem, an etch step can be used to flatten the polysilicon layer and substantially remove the recesses. It also can be necessary to thin the layer in order to be able to sufficiently dope the polysilicon deposited in the trenches. While a traditional approach would be to simply dry etch away part of the layer, such a traditional etch can be problematic. In order to better control the thickness of the polysilicon layer, the polysilicon can be partially oxidized using a process such as a HiPOx oxidation process followed by a wet etchback step. The oxidation of the polysilicon layer can be much more accurately controlled than a standard dry etch step, and can be used to thin the polysilicon layer to an appropriate thickness (as measured outside the trenches), such as a thickness of approximately 4 kÅ. In one example, contour plots for the differences in planarity of the polysilicon trench fill between etching the polysilicon and oxidizing the polysilicon show relative height differences on the order of a 35% variation for a dry etch process and 2% for the oxidation process. The oxidation can be a high pressure oxidation, such as HiPOx process that can have a major advantage of allowing a thick oxide to be grown at a lower temperature and time than a regular oxidation process. This minimization in the temperature and time that is added to the original BCD process can be an important feature in the integration of the trench DMOS with existing BCD process.

After a process step such as a polysilicon back etch, the polysilicon in the trench can be doped through a process such as implantation or diffusion. In an implant process, the dopant can simply be implanted into the polysilicon in the trench using a standard implant technique. Using a diffusion technique, a gas such as POCl$_3$ can be placed in contact with the surface of the 4 kÅ polysilicon layer and allowed to diffuse into the polysilicide-containing trenches 506. The diffusion process can be preferable in many situations because the heat associated with the diffusion process can move the dopant more effectively throughout the polysilicon in the trench, yielding a potentially more uniformly doped trench. In applications where this heat is undesirable, or where the additional heat could negatively impact the other components in the integrated process, the implant technique can be preferred. Further, because the gate polysilicon can be partially etched away with an oxidation process, the device can behave as a planar device as the gate polysilicon flatness and thicknesses can be approximately the same. The same implants and materials can be used as on the vertical DMOS in the existing process. The thicknesses and geometry can be the same for the trench devices, such that no change is necessary to the subsequent process steps.

Figure 6:
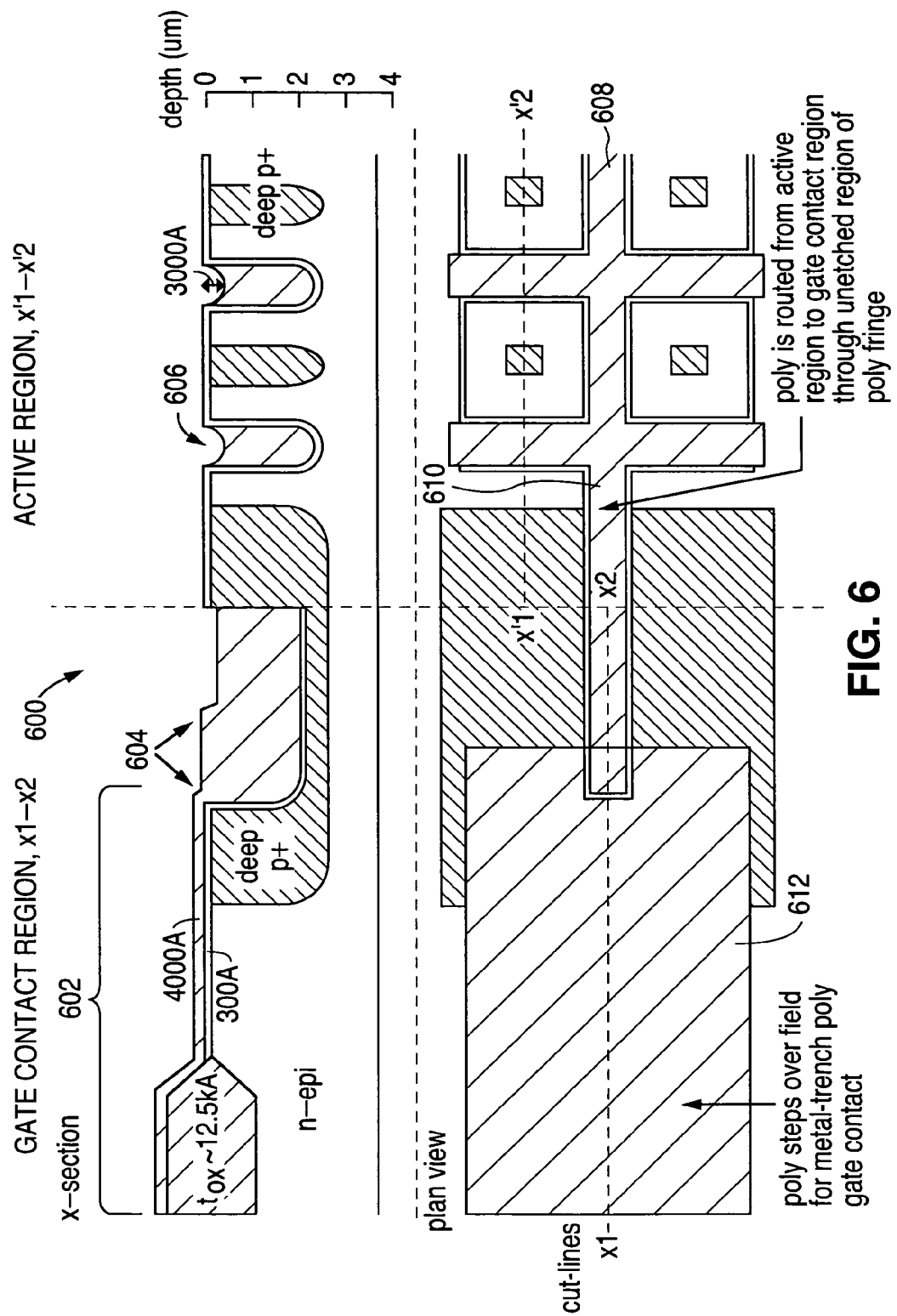
FIG. 6 is a cross-section and top view of a device at a fourth location within a BCD process in accordance with one embodiment of the present invention.

FIG. 6 shows the device 600 after a step in the exemplary process in which a second polysilicon etch step is executed, utilizing a photoresist mask, wherein a 4 kÅ polysilicide layer 602 remains over the field for the metal-trench polysilicon gate contact, shown in the left portion of FIG. 6, but a double step 604 is formed at the trench gate and a recess 606 of about 3 kÅ is formed in each trench. As can be seen in the top view of FIG. 6, the only polysilicon 608 left in the DMOS pattern is in the trench, and the trench-contact area 610, with all the extraneous bits of polysilicon between the trenches having been removed. The only area 612 of polysilicide layer that remains is the contact area on the left. Minimizing the resultant step heights can be quite important. In an existing process, the second polysilicon layer will be the gate of the regular transistor. It can be relatively easy to etch this polysilicon layer in the original device since the layer is flat, and the etch can be more easily controlled to obtain the desired thickness. As soon as any steps are created, residual polysilicon can be left near the edges of each step after the etch process. Unfortunately, the polysilicon cannot simply be over-etched in the integrated process because the 1.5 μm lines, for example, will get smaller, such that subsequent steps would be necessary to get the thickness back to 1.5 μm. In order to keep everything as flat as possible, it can be desirable to keep the polysilicon layer contacting the trench as flat as possible. If necessary, another implant step can be done at this time, such as an adjust for CMOS devices.

Figure 7:
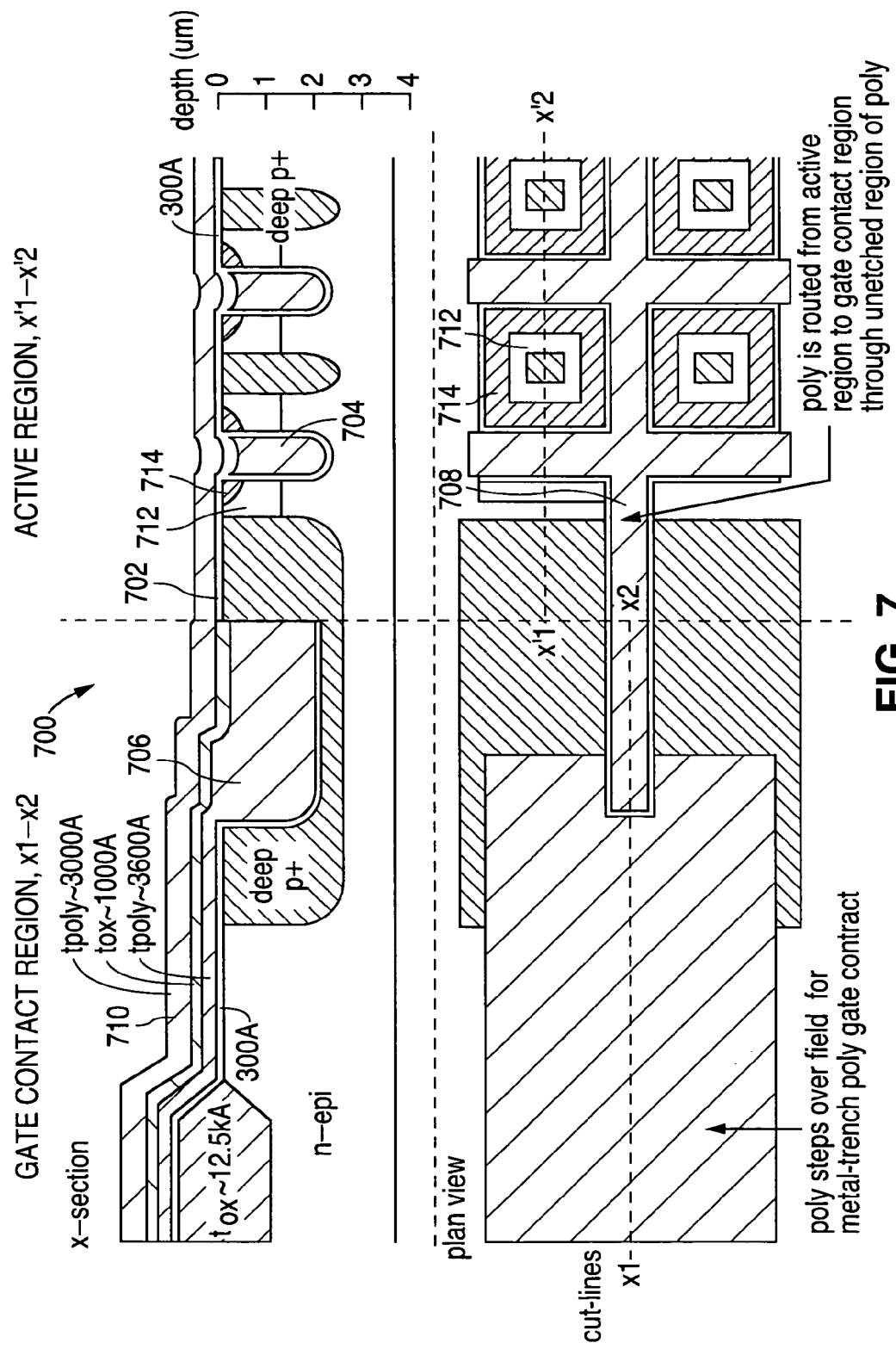
FIG. 7 is a cross-section and top view of a device at a fifth location within a BCD process in accordance with one embodiment of the present invention.

The 300 Å trench gate oxide layer remaining over the field area can be removed from the field area, such as by using a timed etchback procedure. Another gate oxide layer 702 then can be grown on the device 700 as shown in FIG. 7, with a thickness of approximately 300 Å over the field area, which will also grow to a thickness of 3–5× that over the doped polysilicon in the trench areas 704. The oxide will grow to a thickness of about 1.5 kÅ over the trench gate polysilicon, consuming about 400 Å of the polysilicon 706. This oxide layer 702 effectively caps off all the trenches 704, such that the trenches are dielectrically isolated from the outside world, except for the un-etched region 708 of polysilicide extending from the active region to the gate contact region.

After the trenches are capped by the oxide layer, which can be formed to be sufficiently thin and flat, the integrated BCD process can continue exactly as the process existed before the trench steps were included. These steps include, for example, the creation of the p-body regions 712, which act as channels for the trench transistors, and the implanting of the source regions 714, with p-body and source diffusions being self-aligned to the trenches The trench DMOS has then been introduced into the BCD process with only two additional etch steps, and has not necessitated any changes in the remaining steps of the BCD process. Also, a second polysilicon layer 710 can be deposited that can be used as a gate for a CMOS device elsewhere on the chip. Since there are two polysilicon layers 706, 710 separated by a thin oxide layer 702, forming a double polysilicon cap, a capacitor structure can subsequently be formed at that location. The second layer of 'power' metal from the standard process can be used to further decrease the RDS (ON) area.

Figure 8:
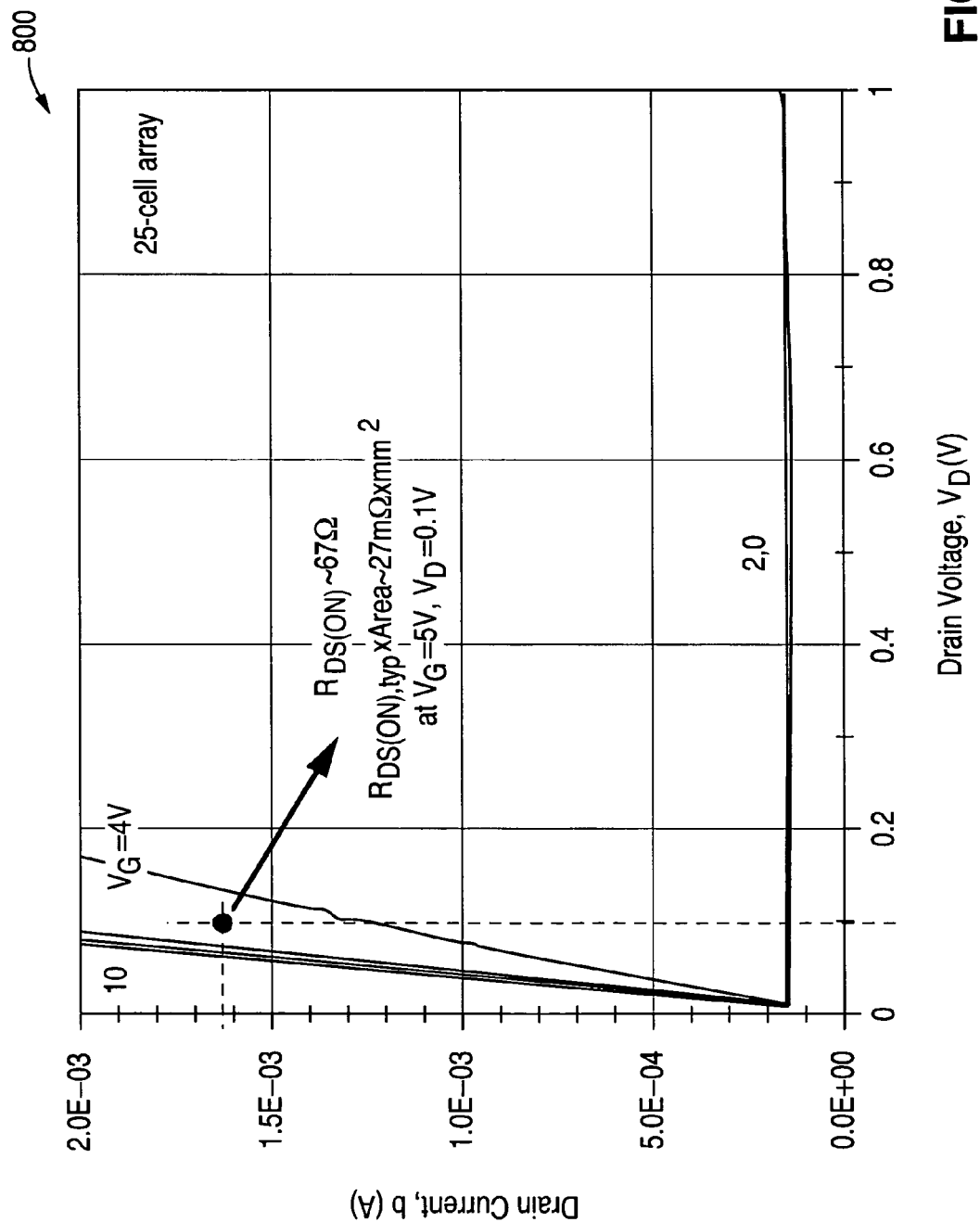
FIG. 8 is a plot showing an output characteristic of a 50V trench VDMOS device in accordance with one embodiment of the present invention.

The minimum polygonal cell pitch in this exemplary process is 3.5 μm, compared with an 11 μm cell pitch for the planar VDMOS device previously utilized in the integrated process/device. This improvement represents about a 300% increase in cell density, making the integrated trench source cells comparable in density with commercial discrete trench VDMOS devices. A typical output characteristic of the 50V trench VDMOS device is shown in the plot 800 of FIG. 8. An on-resistance of 27 mΩ.mm2 can be achieved using the calculation method employed for discrete trench VDMOS, namely:

Area=(number of source cells)*(cell area).

Figure 9:
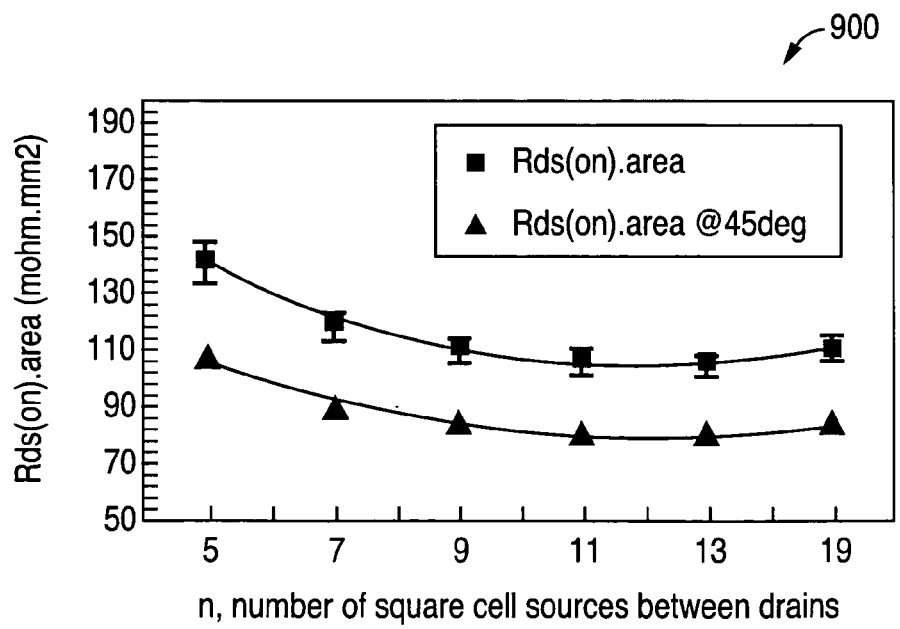
FIG. 9 is a plot showing RDS(ON) area versus the number of cell sources between drains for a device in accordance with one embodiment of the present invention.

However, this Area value can apply only in the limit of infinitely large arrays, since in the integrated trench VDMOS additional device area is consumed by the sinker drain contact to the buried layer. In a process such as the exemplary process described herein, the number of source cells between each drain stripe can be optimized for RDS (ON) area as shown in the plot 900 of FIG. 9.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A BCD device including integrated CMOS and trench DMOS transistors, comprising:
    a vertical trench region formed into an epitaxial layer on a substrate, the vertical trench region extending from a first surface of the epitaxial region the epitaxial layer including at least one implant region and being capable of serving as a drain region for the trench DMOS transistor near an end of the vertical trench region away from the first surface;
    a region of doped polysilicon in the vertical trench region acting as a gate electrode for the trench DMOS transistor, the vertical trench region having a gate portion and a drain contact portion;
    a heavily doped region near the first surface of the epitaxial layer and adjacent the trench region, the heavily doped region acting as a source region for the trench DMOS transistor;
    a p-body region between the source region and drain region, and adjacent the trench region, acting as a channel of the trench power transistor whereby current flows between the source and the drain in a direction substantially away from the first surface; and
    at least one CMOS transistor formed in a layer on the substrate and electrically connected to the trench DMOS transistor.

2. A BCD device according to claim 1, further comprising:
    a gate oxide layer formed on the epitaxial layer and extending over the gate portion of the vertical trench region in order to electrically isolate the gate portion.

3. A BCD device according to claim 1, further comprising:
    first and second polysilicon layers on the epitaxial layer, the first and second polysilicon layers being separated by a gate oxide layer and being capable of serving as a gate for the CMOS device.

4. A BCD device according to claim 1, further comprising:
    a metal contact region formed over the drain contact portion for providing an electrical contact to the trench DMOS transistor.

5. A BCD device including connected CMOS and vertical trench DMOS devices, comprising:
- a plurality of layers formed on a semiconductor substrate, the plurality of layers including an epitaxial layer having a first surface;
- a CMOS device formed in at least one of the plurality of layers; and
- a trench DMOS device formed in the epitaxial layer and connected to the CMOS device, the trench DMOS device including:
  - a trench region in the epitaxial layer extending from the first surface, the trench region including an active portion and a gate contact portion, the active portion containing a doped polysilicon operable to act as a gate for the trench DMOS device;
  - a heavily doped source region in the epitaxial layer extending from the first surface and adjacent the active portion of the trench region, the heavily doped source region operable to act as a source for the trench DMOS device; and
  - a doped channel region formed adjacent the heavily-doped source region, opposite the first surface, and the doped polysilicon region, whereby the doped channel region is operable to act as a channel of the trench DMOS device and the epitaxial layer is operable to act as a drain for the trench DMOS device, whereby current flows from the source to the drain through the channel in a direction substantially away from the first surface.

6. A BCD device according to claim 5, further comprising:
- a gate oxide layer formed on the first surface of the epitaxial layer and extending over the gate contact portion of the trench region in order to electrically isolate the gate contact portion.

7. A BCD device according to claim 5, further comprising:
- a polysilicon gate layer formed on the gate oxide layer and capable of serving as a gate for the CMOS device.

* * * * *

UNITED STATES PATENT AND TRADEMARK OFFICE
CERTIFICATE OF CORRECTION

| | | |
|---|---|---|
| PATENT NO. | : 7,067,879 B1 | Page 1 of 1 |
| APPLICATION NO. | : 10/857152 | |
| DATED | : June 27, 2006 | |
| INVENTOR(S) | : Terry Dyer et al. | |

It is certified that error appears in the above-identified patent and that said Letters Patent is hereby corrected as shown below:

TITLE PAGE, ITEM [54] REPLACE TITLE WITH FOLLOWING TEXT:

--INTEGRATION OF TRENCH POWER TRANSISTORS INTO A 1.5 μm BCD PROCESS--.

Column 6, line 31, change "first surface of the epitaxial region" to --first surface of the epitaxial region,--.

Signed and Sealed this

Twelfth Day of September, 2006

JON W. DUDAS
*Director of the United States Patent and Trademark Office*